(12) United States Patent
Knorr, Jr. et al.

(10) Patent No.: US 10,355,150 B2
(45) Date of Patent: Jul. 16, 2019

(54) METHOD OF PASSIVATING AND ENCAPSULATING III-V SURFACES

(71) Applicant: THE UNITED STATES OF AMERICA AS REPRESENTED BY THE SECRETARY OF THE ARMY—U.S. ARMY RESEARCH LABORATORY, Washington, DC (US)

(72) Inventors: Daniel B. Knorr, Jr., Port Deposit, MD (US); Nathan C. Henry, Baltimore, MD (US); Joseph L. Lenhart, Port Deposit, MD (US); Neil F. Baril, Stafford, VA (US); Meimei Tidrow, Annandale, VA (US); Sumith Bandara, Fairfax, VA (US); Jan Andzelm, Northeast, MD (US); Kristen S. Williams, Madisonq, AL (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 169 days.

(21) Appl. No.: 15/194,604

(22) Filed: Jun. 28, 2016

(65) Prior Publication Data
US 2017/0373206 A1 Dec. 28, 2017

(51) Int. Cl.
*H01L 31/00* (2006.01)
*H01L 31/0352* (2006.01)
*H01L 31/18* (2006.01)
*H01L 31/0216* (2014.01)

(52) U.S. Cl.
CPC ......... *H01L 31/035236* (2013.01); *H01L 31/02167* (2013.01); *H01L 31/184* (2013.01); *H01L 31/186* (2013.01); *H01L 31/1868* (2013.01); *Y02E 10/544* (2013.01); *Y02P 70/521* (2015.11)

(58) Field of Classification Search
CPC ......... H01L 31/035236; H01L 31/0203; H01L 31/0304; H01L 31/186; H01L 31/1868; H01L 31/184
See application file for complete search history.

(56) References Cited

U.S. PATENT DOCUMENTS

| | | | |
|---|---|---|---|
| 4,032,488 A * | 6/1977 | Hokkoku | C08B 37/0021 351/159.02 |
| 4,448,633 A | 5/1984 | Shuskus | |
| 5,255,281 A * | 10/1993 | Sugano | B82Y 20/00 372/45.01 |
| 5,476,816 A * | 12/1995 | Mautz | H01L 21/32136 257/E21.311 |

OTHER PUBLICATIONS

Cysteamine-Based Functionalization of InAs Surfaces: Revealing the critical Role of Oxide Interactions in Biasing Attachment, by Losurdo et al, dated 2011, published by ACS Publications, pp. 1235-1245.*

* cited by examiner

*Primary Examiner* — Mounir S Amer
*Assistant Examiner* — Alexander Belousov
(74) *Attorney, Agent, or Firm* — Robert Thompson; Alan I. Kalb

(57) ABSTRACT

A method for producing a surfaced passivated, encapsulated surface III-V type II superlattice (T2SL) photodetector, more specifically a p-type heterojunction device by cleaning, etching and exposing the surface of a III/V material to solution mixtures which simultaneously removes oxides from the surface and encapsulates the surfaces.

9 Claims, 4 Drawing Sheets

METHOD OF PASSIVATING AND ENCAPSULATING III-V SURFACES

GOVERNMENT INTEREST

The embodiments described herein may be manufactured, used, and/or licensed by or for the United States Government without the payment of royalties thereon.

BACKGROUND

Technical Field

The present invention generally relates to III-V semiconductor materials. More particularly, this invention relates to passivated, encapsulated III/V surfaces that have long-term stability against water and oxygen infiltration.

The use of engineered materials that can be designed to meet higher demands for performance and/or tailored to specific applications is becoming increasingly prevalent in various fields. This is true in the field of infrared detectors with type II superlattices (T2SL) based on the III-V antimonides. Recent improvements in epitaxial growth techniques have enabled a wide variety of device architectures to be investigated. Both theoretical predictions of Auger current suppression and the potential to leverage the III-V industrial base have driven exploration of this material system as a potential alternative to mercury cadmium telluride (MCT) for infrared detection. Very promising results for infrared detectors based on T2SLs are beginning to surface in literature; however, surface leakage currents remain a challenge that needs to be addressed, especially in p-type material based devices with an electron as the minority carrier. As the complexity of device architectures for T2SLs has increased so has the complexity of the chemistry on the sidewalls of detectormesa structures. Dangling bonds and defects causing band bending and Fermi level pinning as well as the spontaneous formation of conductive native oxides along the mesa sidewall, form low resistance pathways for surface leakage currents. The challenge of addressing surface leakage pathways becomes greater as the bandgap of the material becomes smaller as is the case with long wavelength infrared (LWIR) materials. There are several potential avenues to address surface leakage and attain the theoretically predicted performance.

The spontaneous formation of conductive native oxides on the surface of the III-V LWIR devices presents a significant challenge to studying the surface chemistry of III/V materials, and hinders efforts of finding ideal surface passivation treatments. Deposition of thiolated Self-Assembled Monolayers (SAM) may enable surface treatment studies by preventing oxidation via excluding the access of oxygen and moisture to the surface. The potential exists to use the SAM as a sacrificial layer for passivation with the subsequent deposition of a dielectric such as, for example, $SiO_2$ or SiNx. Preventing the formation and encapsulation of the native oxide between the surface of the T2SL and dielectric material would improve uniformity. Specifically, avoiding oxidation prior to or during the chemical vapor deposition (CVD) process will enable a superior dielectric interface by preventing the formation of conductive pathways between the sidewalls and dielectric layer. With the III-V based infrared detectors it is well known that the plasma processing steps do induce damage on the surface, and thus are followed by cleaning the surfaces with acidic solutions to remove oxides and surface damage. Molecular surface attachment as a step within the manufacturing process is not common, but is novel, particularly as described in the invention disclosure.

The class of III/V materials are of interest in a variety of applications including electronics, detectors and sensors. One persistent challenge is the limitation of surface oxides of the III/V materials that may be conducting and may result in unwanted leakage current, dark current or surface conductivity in various applications. These surface oxides may be present initially or may be present after prolonged exposure to oxygen in the environment. A variety of techniques have been employed to passivate the surfaces of III-V materials, and they can broadly be placed into four categories: (1) strategies employing an inorganic overlayer directly on the surface, (2) strategies that attempt to bond sulfur or sulfur-containing thiol molecules directly to the III-V material, (3) organic strategies that involve coating surfaces with polymers, and (4) use of coupling agents such as silanes. A discussion of these strategies can be found in the introduction of *Use of 3-aminopropyltriethoxysilane deposited from aqueous solution for surface modification of II-V materials*, Applied Surface Science 320 (2014) 414-428, and in *Chemical and physical passivation of type II strained-layer superlattice devices by means of thiolated self-assembled monolayers and polymer encapsulates*, Infrared Physics & Technology 70 (2015) 48-52, the complete disclosures of which are herein incorporated by reference. Sulfur has been shown to covalently bond with III/V semiconductors and decreases the inter-gap surface states along the sidewall and shows the potential for simultaneous oxide removal and sulfur passivation.

Recently, we have shown that a version of the second strategy listed above employing cysteamine, previously investigated, can be used to passivate exposed III-V semiconductor surfaces on the sidewalls of type II superlattice (T2SL) photodetectors, thereby reducing surface current leakage and improving photodiode performance. While promising, this initial work lacked an understanding of how cysteamine bonds to the InAs surface and how this affects the band structure at the interface. We hypothesize that the passivation mechanism itself is both physical and electronic. More specifically, deposition of cysteamine creates self-assembled monolayers (SAMs), which provide a physical barrier against diffusion of oxygen, water, and other environmental contaminants to the sidewall surface. Electronic passivation is achieved simultaneously because sulfur atoms in the cysteamine molecules passivate dangling bonds through covalent linkages, thereby eliminating surface defect states in the electronic band gap.

The embodiments described herein generally relate to passivated, encapsulated III/V surfaces that have long-term stability against water and oxygen infiltration. The disclosed method involves cleaning, etching and surface passivating III/V surfaces followed by encapsulation with either a polymer that is covalently bound to the interface or with an organic overlayer. Embodiments are also of use in numerous aaplications including night-vision, specifically in long infrared strained layer super lattice based detectors and hear transfer processes.

SUMMARY

In embodiments, this disclosure involves a method of cleaning, etching and surface passivation III/V surfaces using a chemical solution that simultaneously removes existing surface oxides and adds a chemically functionalized passivation layer. Specifically, a surface composed of a III/V material such as, but not limited to, InAs, GaSb, InSb, or GaAs, or a lattice thereof, or a device composed of these materials is 1.) exposed to a plasma cleaning step to remove organic or other contaminants
2.) subsequently etched in an acid and peroxide solution
3.) exposed to a chemical solution (solvent, sulfur or non-oxygen chalcogen containing organic molecule or silane coupling agents or phosphorous based coupling agents, or a combination of these molecules together or in sequence and in either a base or an acid) that simultaneously removes the residual surface oxide while also depositing a passivation layer
4.) surfaces are then utilized directly or are encapsulated to prevent future oxidation by means of either
a. polymer deposition and reaction with the functionalized passivation layer.
b. deposition of an inorganic encapsulation layer wherein the previously deposited passivation layer acts as a "sacrificial" layer and is removed during inorganic deposition.

In embodiments the invention enables the long-term stability of III/V material-based strained layer superlattice infrared detectors, composite materials, semiconductors, multi-junction photovoltaic cells, transistors, bioinformatics, biosensors, thermovoltaics, chemical sensors and the like.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
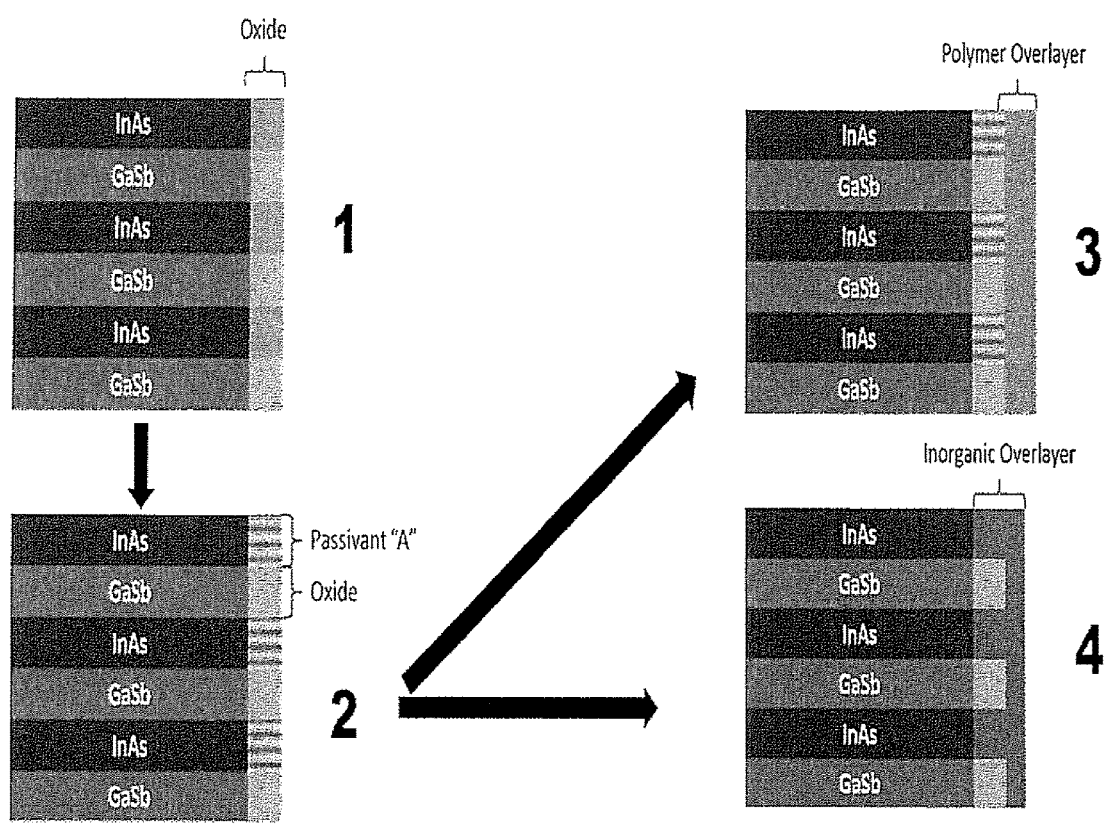
FIG. 1 illustrates the processing steps showing the potential for etching and passivation of InAs/GaSb superlattices with only InAs treatment and with no treatment for GaSb. Step (1) depicts strained-layer superlattice with a residual oxide from previous processing or from an oxygen plasma treatment. Step (2) depicts surface after simultaneous etch and passivate molecule deposition that is selective for InAs, while GaSb oxide remains intact. At this point, the process can proceed to either step (3) deposition of a polymer overlayer that is covalently bound or non-covalently bound to the InAs passivate molecules or step (4) deposition of an inorganic overlayer (e.g., atomic layer deposition, chemical vapor deposition, etc.) wherein the inorganic overlayer process may remove the sacrificial passivants.
Figure 2:
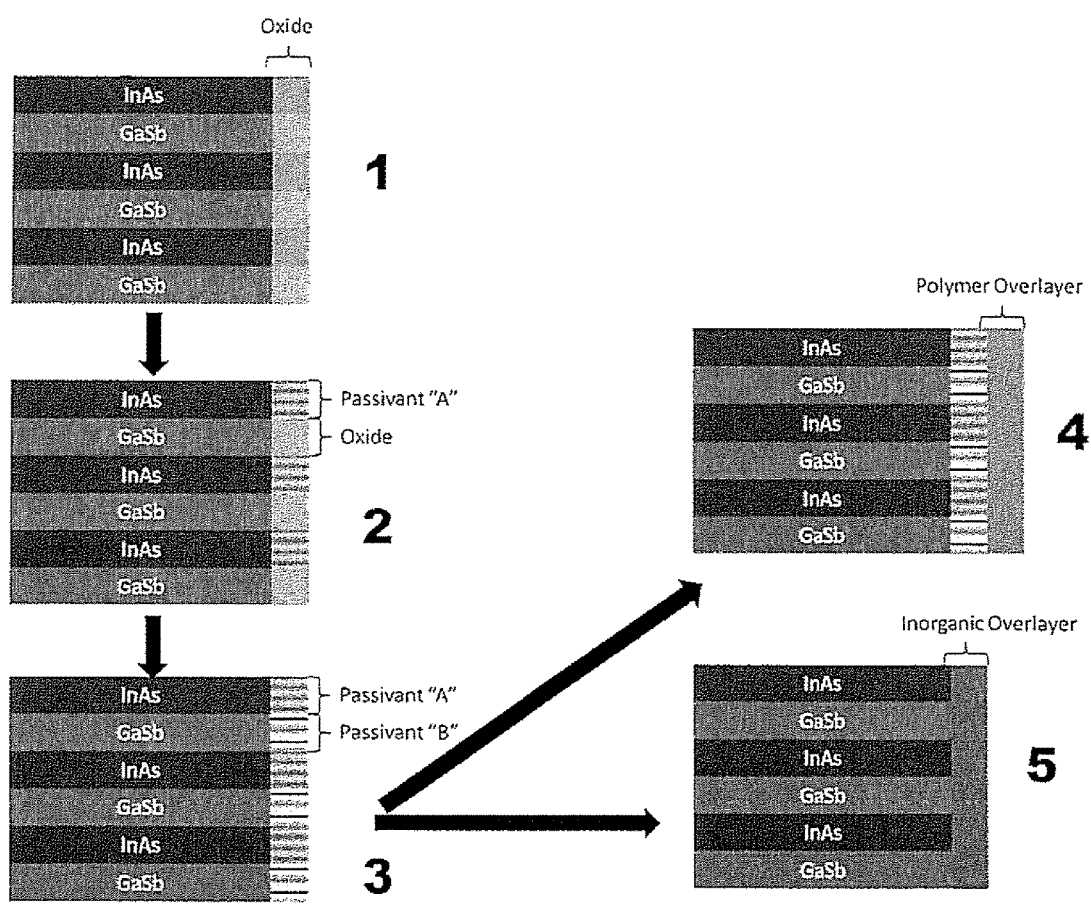
FIG. 2 illustrates the processing steps showing the potential for selective etching and passivation of InAs/GaSb superlattice passivation. Step (1) depicts strained-layer superlattice with a residual oxide from previous processing or from an oxygen plasma treatment. Step (2) depicts the surface after simultaneous etch and passivate molecule deposition that is selective for InAs, while GaSb oxide remains intact. Step (3) depicts the surface after simultaneous etch and passivate molecule deposition that is selective for GaSb. At this point, the process can proceed to either step (4) deposition of a polymer overlayer that is covalently bound or non-covalently bound to the passivate molecules or step (5) deposition of an inorganic overlayer (e.g., atomic layer deposition, chemical vapor deposition, etc.) wherein the inorganic overlayer may remove the sacrificial passivants.

The embodiments herein and the various features and advantageous details thereof are explained more fully with reference to the non-limiting embodiments that are illustrated and detailed in the following description.

The embodiments of the present invention provide for a solvent, for example ethyl acohol, a caustic or acid and a passivate molecule further including a sulfur-containing moiety, a silane derivative, or a phosphorous derivative. The passivate molecule may have another functional group such as the amine group in cysteamine. The III/V surfaces such as, for example InSb, InAs, GaSb, GaAs, InP and superlattice combination or structures of these are placed in the chemical solution for from about 18 to 36 hours at a temperature of from about 25 to 60 degrees Celsius resulting in a removed and/or passivated oxide layer. The surfaces may then be encapsulated with a polymer that will react with the surface. Alternatively, surface molecules can be used as a "sacrificial" layer that can protect the material subsequent deposition of an inorganic encapsulation layer by, for example atomic layer deposition or chemical vapor deposition.

Examples of suitable solvents include but is not limited to water, ethanol, methanol, isopropanol, tetrahydrofuran, dichloromethane, dichloroethane, dimethylformamide, toluene, acetone, methyl ethyl ketone hexanes, and the like.

Silane coupling agents include, for example, alkylsilanes (including but not limited to octadecyltriethoxysilane, hexadecyltriethoxysilane, tetradecyltriethoxysilane, dodecyltriethoxysilane, decyltriethoxysilane, octyltriethoxysilane, hexyltriethoxysilane, butyltriethoxysilane), 3-aminopropyltriethoxysilane, vinyl functionalized silanes, and the like.

Examples of suitable phosphorous-based coupling agents include, for example, 1-octadecanephosphonic acid, 1-hexadecanephosphonic acid, 1-tetradecanephosphonic acid, 1-dodecanephosphonic acid, 1-decanephosphonic acid, 1-octanephosphonic acid, 1-hexanephosphonic acid, 1-butane phosphonicacid), alkylphosphates (including but not limited to: octadecylphosphate, hexadecylphosphate, tetradecylphosphate, dodecylphosphate, decylphosphate, octylphosphate, hexylphosphate, butylphosphate), 3-aminopropyl phosphonic acid and the family of amine-functionalized phosphonic acids and phosphonates (e.g., phosphorylethanolamine), vinyl functionalized organophosphorous compounds and the like.

Examples of polymers used in encapsulating the III/V surface include, for example, polyetherimides, polyimides, epoxy resins cured with diamines, dianhydrides or other curing agents. Polyurethanes, polyketones, polycarbonates, polyesters, polyacrylates, polymethacrylates, polystyrenes, polybutadienes, ring opening metathesis polymers (e.g., polynorbornene), polyethylene/polypropylene and the like.

Acids suitable for the III/V solutions include, but are not limited to, citric acid, acetic acid, hydrochloric acid, hydrofluoric acid, sulfuric acid, perchloric acid and the like.

Bases suitable for the III/V solutions include, but are not limited to, ammonium hydroxide, sodium hydroxide, potassium hydroxide, pyridine, methylamine, imidazole and the like.

No prior art exists demonstrating excitation this method of passivation. Prior art methods failed because of reoxidation of the surface at some point during processing due to the lack of a surface passivation layer, lack of a surface suitable for subsequent encapsulation with a polymer or inorganic overlayer or passivation of one III/V material in a superlattice but without successful treatment of other present.

The invention describes a method to provide passivated, encapsulated III/V surfaces that have long-term stability against water and oxygen infiltration. The method further describes cleaning, etching and surface passivation of III/V surfaces followed by encapsulation with either a polymer that is covalently bound to the interface or with an inorganic overlayer. Cleaning is achieved via oxygen plasma ash or other oxidation methods, while etching is achieved via an acidic solution. Passivation is achieved by using a chemical solution that simultaneously removes existing surface oxides and adds a chemically functionalized passivation layer. This passivation layer can be deposited in acidic or alkaline conditions and can be composed of either sulfur or other chalcogen-containing groups such as thiols, including hexanethiol (C6SH), dodecanethiol (C12SH), octadecanethiol (C18SH), and cysteamine, silanes, or organophosphorous compounds such as phosphonic acids or phosphonic esters. Subsequent encapsulation occurs via exposure to monomers capable of reactions with each other and the interface, or via deposition of an inorganic overlayer. During inorganic overlayer deposition, the passivation layer can act as a "sacrificial" layer and can be removed at high temperatures of from about 100 degrees Celsius to about 300 degrees Celsius in the apparatus wherein inorganic layer deposition is conducted.

EXAMPLES

Having described the invention, the following examples are given to illustrate specific applications of the invention including the best mode now known to perform the invention. These specific examples are not intended to limit the scope of the invention described in this application.

Example 1

The III/V material used for the examples is obtained as follows. A 150 nm thick buffer of undoped GaSb was deposited on an n-GaSb substrate followed by a 1 μm layer of insulating $AlAs_xSb_{1-x}$ to prevent significant conduction from the GaSb substrate. The $AlAs_xSb_{1-x}$ barrier was lattice-matched to the GaSb substrate. Subsequent absorber growth consisted of 400 periods of InAs/GaSb 42/21 Å for a total thickness of 2.52 μm at a target Be doping level of $1.1 \times 1016$ $cm^{-3}$. Finally, a 50 Å top contact layer of GaSb was grown and doped with Be at $4.0 \times 1018$ $cm^{-3}$. The sample underwent a surface cleaning preparation, which consisted of separate sonications in hexane, acetone, and ethanol, an $O_2$ plasma ash, and a rapid dip in $H_2SO_4$/citric acid etch followed by a water rinse. The quality of deposition achieved is highly dependent upon cleanliness of the surface prior to passivation. In order to simplify the processing procedure, all devices were delineated using a $H_3PO_4$/citric acid solution. After surface cleaning, sample was submersed in a solution for simultaneous etching/passivation. The solution consisted of 10 mM of hexanethiol (passivate molecule) dissolved in pure, semiconductor grade ethanol (9 parts by volume) with $NH_4OH$ (1 part of 28% $NH_4OH$ in water by volume). The solution was immersed in a water bath at 40° C. and was left for over 24 hours. The resulting surface resistance at 77K as measured by quantitative mobility spectrum analysis (QMSA) was $2.74 \times 10^7 \Omega$, which showed about a 3 order of magnitude increase as compared to the QMSA result from an unpassivated sample ($4.33 \times 10^4 \Omega$). This indicates that the surface was successfully passivated.

Example 2

The method described in Example 1 was followed except that the passivation solution consisted of 10 mM of cysteamine (passivate molecule) dissolved in pure, semiconductor grade ethanol (9 parts by volume) with $NH_4OH$ (1 part of 28% $NH_4OH$ in water by volume). The solution was immersed in a water bath at room temperature and was left for over 24 hours. The resulting surface resistance at 77K as measured by QMSA was $1.03 \times 10^8 \Omega$, which was again much higher than that of an unpassivated sample ($4.33 \times 10^4 \Omega$), suggesting that the surface was successfully passivated.

Example 3 Comparative

To demonstrate the utility of the simultaneous etch and deposition we followed the method described in EXAMPLE 2 except that the passivation solution consisted of 100 mM of cysteamine (passivate molecule) dissolved in pure, semiconductor grade ethanol without $NH_4OH$. The solution was immersed in a water bath at 40° C. and was left for over 24 hours. The resulting surface resistance at 77K as measured by QMSA was $2.07 \times 10^5 \Omega$, which was higher than that of an unpassivated sample ($4.33 \times 104 \Omega$), but not as high as that in Example 2, which employed the $NH_4OH$.

Example 4

Figure 3:
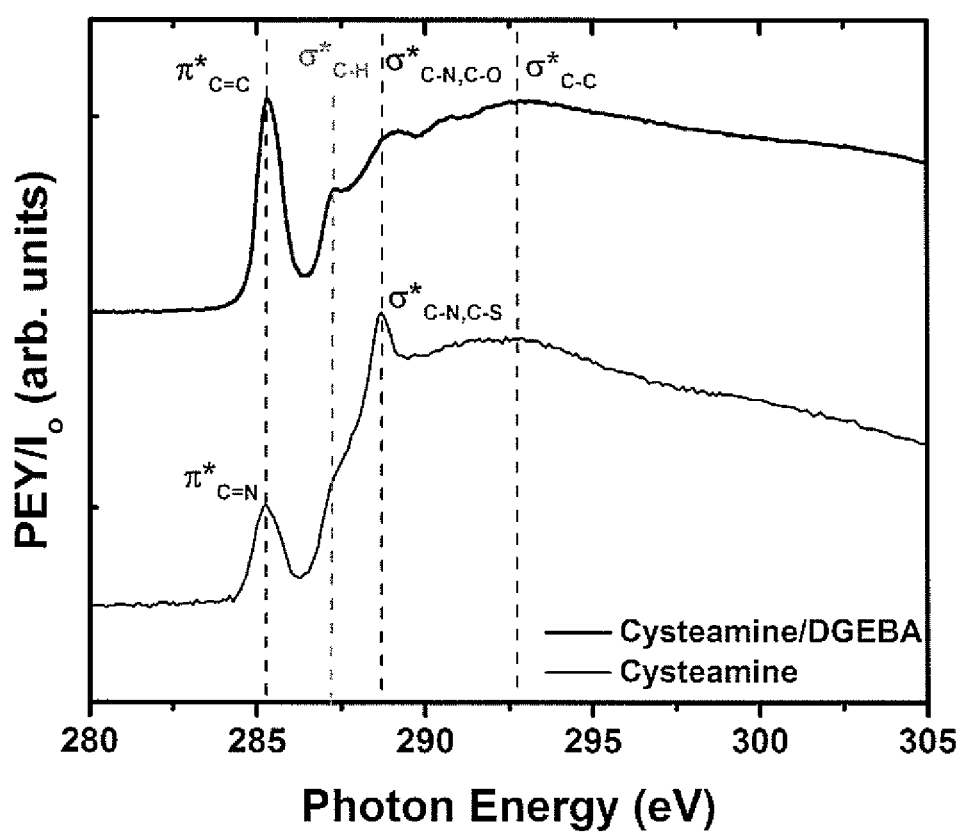
FIG. 3 illustrates edge-jump normalized NEXAFS plots of the C is region are shown in FIG. 3 in order to demonstrate covalent boding of a resin (diglycidyl ether of bisphoneol A) to a treated InAs surface. As shown, the cysteamine-only treatment shows a small $\pi^*$ peak associated with $C=N$ bonds induced by degradation of the NH2 upon exposure to the X-rays, but the sample with DGEBA shows a strong $\pi^*$ peak associated with the $C=C$ bonds in the DGEBA monomer.

To demonstrate the ability to cap III/V materials with a polymer encapsulant, undoped InAs wafers (Wafer Technology, Ltd., UK) were first diced and then degreased in hexanes for one hour followed by sonication for 5 minutes each in hexanes, acetone and ethanol. After sonication, the wafers were ashed by exposure to oxygen plasma (30 W for 4 minutes). Immediately after ashing, the wafers were subjected to a rapid dip in a $H_2SO_4$/citric acid etch followed by a water rinse. The wafers were removed from this solution, rinsed with water and were then blown dry with ultrahigh purity nitrogen. Next, the wafers were introduced into a solution of a 20 mM solution of cysteamine in ethanol (9 parts) with (1 part) 28% $NH_4OH$ in water at 40° C. Samples were exposed to this solution at this temperature for 24 hours and were then removed, rinsed with copious amounts of ethanol, dried with nitrogen, and then stored in an air atmosphere prior to analysis. The InAs wafers were then placed in diglycidyl ether of bisphenol A (DGEBA) at 60° C. overnight. The wafers were then removed and were sonicated sequentially in toluene and ethanol for 30 minutes each to remove physisorbed DGEBA. These samples were measured using near-edge X-ray absorption fine structure (NEXAFS), in a method that has been used previously to gauge the availability of reactive amines on a surface. Edge-jump normalized NEXAFS plots of the C 1s region are shown in FIG. 3. As shown, the cysteamine-only treatment shows a small $\pi^*$ peak associated with C=N bonds induced by degradation of the $NH_2$ upon exposure to the X-rays, but the sample with DGEBA shows a strong $\pi^*$ peak associated with the C=C bonds in the DGEBA monomer. These data demonstrate that DGEBA was covalently bonded to the cysteamine.

Example 5

Figure 4:
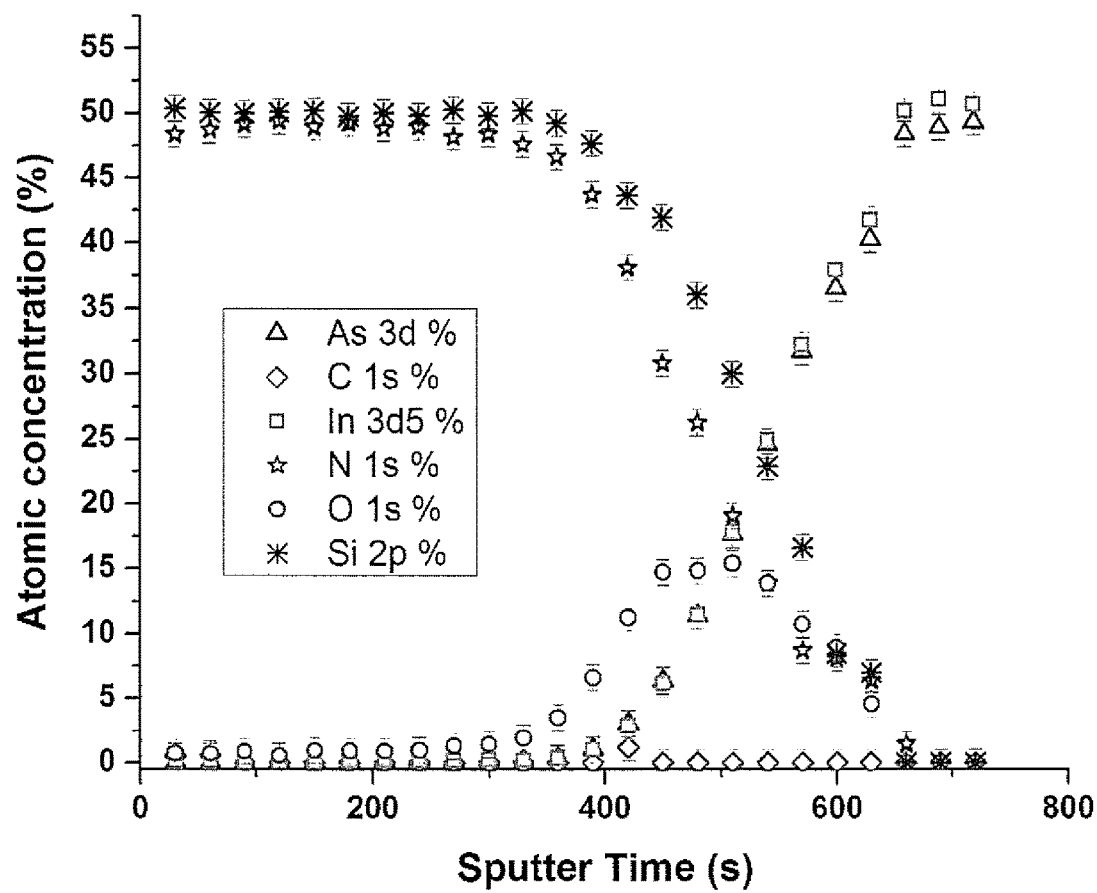
FIG. 4 illustrates XPS depth profiling of the sacrificial nature of the passivation layer during an inorganic encapsulant deposition, which showed that no carbon and no sulfur were detected at the interface, while oxygen was limited in the interfacial region to ~15 at %.

In order to demonstrate the sacrificial nature of the passivation layer during an inorganic encapsulant deposition, we prepared an InAs wafer in the matter described in Example 4 except that the wafer was used to deposit a silicon nitride overlayer using an inductively coupled plasma chemical vapor deposition (ICP-CVD) method. The cysteamine treated wafer was placed into the ICP-CVD chamber and, which was evacuated and then heated to 120° C. The plasma was struck at a pressure of 5 mtorr, an ICP power of 400 W with $SiH_4/N_2$/Ar flow rates of 9 sccm/12 sccm/5 sccm. Then, the deposition was conducted at $SiH_4/N_2$/Ar flow rates of 9 sccm/12 sccm/0 sccm at an ICP power of 400 W at 5 mtorr for 10 minutes. The sample was cooled, removed from the chamber and characterized using XPS depth profiling, see FIG. 4, which showed that no carbon and no sulfur were detected at the interface, while oxygen was limited in the interfacial region to ~15 at %. This implies that the passivation remained successful (limited oxygen) and that the cysteamine was no longer on the surface (no sulfur, no carbon).

What is claimed is:

1. A method for producing a passivated, encapsulated III/V material surface comprising:
    a) cleaning a III/V material surface using an oxygen plasma ash to remove organic and surface oxides;
    b) etching the surface in an acid or a peroxide solution followed by a water rinse;
    c) submerging the surface in a first solution selected from the group consisting of a solvent, a sulfur molecule, a non-oxygen chalcogen-containing an organic molecule, a silane coupling agent, a phosphorous-based coupling agent, ammonia, phosphoric acid, hydrofluoric acid and mixtures thereof;
    d) wherein said first solution simultaneously removes oxides or other conductive components from the surface and deposits a passivation layer to the surface;
    d) exposing the surface of the III/V material to a second solution that is selected from the group consisting of a solvent, a sulfur molecule, a non-oxygen chalcogen-containing an organic molecule, a silane coupling agent, a phosphorous-based coupling agent, ammonia, phosphoric acid, hydrofluoric acid and mixtures thereof; and
    e) encapsulating the surface by a polymer deposition or an inorganic encapsulation.

2. The method according to claim 1, wherein the surface is encapsulated by a coupling agent or a surface modifier capable of reacting and covalently bonding with the surface.

3. The method according to claim 1, wherein said passivating layer is a sacrificial, removable layer, removed prior to an inorganic encapsulation deposition.

4. The method according to claim 1, wherein said passivating layer is an adhesion promoter between the III/V material surface and said inorganic encapsulate.

5. The method according to claim 4 where the passivation layer is deposited in an acidic or an alkaline solution.

6. The method according to claim 5 wherein the passivation layer is deposited in an acidic solution.

7. The method according to claim 6 wherein the acidic solution is selected from the group consisting of citric acid, acetic acid, hydrochloric acid, hydrofluoric acid, sulfuric acid, perchloric acid, or mixtures thereof.

8. The method according to claim 5 wherein the passivation layer is deposited in an alkaline solution.

9. The method according to claim 8 wherein the base is selected from the group consisting of ammonium hydroxide, sodium hydroxide, potassium hydroxide, pyridine, methylamine, imidazole and mixtures thereof.

* * * * *